United States Patent
Lee et al.

(10) Patent No.: US 7,573,138 B2
(45) Date of Patent: Aug. 11, 2009

(54) STRESS DECOUPLING STRUCTURES FOR FLIP-CHIP ASSEMBLY

(75) Inventors: Chien-Hsiun Lee, Hsin-Chu (TW); Mirng-Ji Lii, Sinpu Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 428 days.

(21) Appl. No.: 11/565,375

(22) Filed: Nov. 30, 2006

(65) Prior Publication Data

US 2008/0128885 A1 Jun. 5, 2008

(51) Int. Cl.
*H01L 23/48* (2006.01)
*H01L 23/52* (2006.01)
*H01L 29/40* (2006.01)

(52) U.S. Cl. ...................... 257/778; 257/786
(58) Field of Classification Search ................. 257/778, 257/787, 686, 777, 786, 783, 780, 781, 782
See application file for complete search history.

(56) References Cited

U.S. PATENT DOCUMENTS

| 6,020,220 | A | 2/2000 | Gilleo et al. | |
|---|---|---|---|---|
| 6,191,952 | B1 | 2/2001 | Jimarez et al. | |
| 6,399,426 | B1 | 6/2002 | Capote et al. | |
| 6,479,900 | B1 * | 11/2002 | Shinogi et al. | 257/758 |
| 6,597,070 | B2 * | 7/2003 | Miyazaki | 257/778 |
| 2001/0026021 | A1 * | 10/2001 | Honda | 257/778 |
| 2002/0109228 | A1 * | 8/2002 | Buchwalter et al. | 257/738 |
| 2002/0121689 | A1 * | 9/2002 | Honda | 257/700 |
| 2005/0082681 | A1 * | 4/2005 | Wijdenes | 257/778 |
| 2006/0131746 | A1 * | 6/2006 | Kohara et al. | 257/737 |

* cited by examiner

*Primary Examiner*—S. V Clark
(74) *Attorney, Agent, or Firm*—Duane Morris LLP

(57) ABSTRACT

A stress decoupling structure provided underneath the under-ball-metallurgy (UBM) pads of a flip-chip bonding integrated circuit (IC) chip enhances the cyclic fatigue life of the solder joints formed by the solder bumps on the IC chip. The stress decoupling structure is formed from an elastic polymer layer provided over the active surface of the integrated circuit chip. A plurality of conductive metal posts are formed in the elastic polymer layer, extending between one of the contact pads on the active surface of the chip and one of the UBM pads. Solder bumps provided on the UBM pads form the solder joints between the chip and the next level interconnect structure.

10 Claims, 1 Drawing Sheet

STRESS DECOUPLING STRUCTURES FOR FLIP-CHIP ASSEMBLY

FIELD OF THE INVENTION

The present invention relates to electronic packaging technology incorporating flip-chip assemblies.

BACKGROUND

Integrated circuit (IC) chips or modules are often connected to chip carriers, and sometimes directly to PC boards or cards by flip-chip attachment technology. Small solder bumps or balls are formed on an active surface of the chip. The chip is then turned over and placed on the carrier, board or other substrate to which it will be attached. The components are heated to cause the solder bumps to reflow in a controlled collapse which completes electrical connections between the chip and substrate. This technology has numerous advantages, including compact connections, electrical performance and cost, that have made it one of the industry standards. However, three area certain disadvantages that have prevented even wider adoption.

One of the disadvantages results from differences in the coefficients of thermal expansion (CTE) of the chip and the substrate. Common IC chip materials such as silicon, germanium and gallium arsenide usually have CTEs of about 3 to about 6 ppm/degree C. Organic chip carriers to which the chips are attached and organic printed circuit boards and cards, which are usually composites of organic dielectrics and metallic circuitry, tend to have CTEs between about 12 and about 20 ppm/degree C. Despite this mismatch in CTE, circuited organic dielectrics are used in many applications because they have a number of advantages (including cost, ball-grid-array ("BGA") life and dielectric constant) over other materials (such as ceramics) which have CTEs closer to the CTE of the chip. The use of materials with this CTE mismatch does create problems, however. When such package is heated or cooled, the lateral expansion or contraction of the carrier is substantially greater than the lateral expansion or contracting of the chip. This creates a shear strain on the solder bump joints. Many electronic comments routinely experience thermal cycles in their ordinary operation, and these cycles are sometimes aggravated by fluctuations in the environmental conditions. Thermal cycles in excess of 100 degrees C. are rather common. Under extreme operating or environmental conditions they may exceed 125 degrees C. The cyclical stress/strain inflicted on the solder bump connections by these thermal cycles in one of the primary causes for premature fatigue failure of these solder bump connections. As these components are heated and cooled the substrates expand and contract much more than the chips. With a simple chip to substrate connection, the strain from the unequal expansion is absorbed primarily by the soft solder. With repetitive thermal cycles, which are inescapable with many electronic components, the solder joints are likely to fail.

A conventional approach to this problem is to surround the solder joints with a dielectric underfill material that matches or approximates the CTE of the solder joints, which is typically about 22 to about 28 ppm/degree C. Typical underfill materials are epoxy-based anhydride systems. They are normally heavily filled with very small particles of materials such as silicon dioxide to produce the desired CTE. The filler also gives the underfill a high modulus (as used herein, the term "modulus" refers to the storage modulus) typically greater than about 2 GPa or about 300 ksi. The underfill bears most of the load resulting from the differential expansion of the chip and substrate, and reduces the strain on the solder joints. However, by restricting the differential expansion between the chip and substrate, the relatively strong coupling between the chip and carrier has a tendency to warp both the chip and the carrier. This increases loads acting normal to the surface of the substrate to which the carrier is attached. For example, as the package cools after the carrier has been attached to a printed circuit board or card, typically with an array of solder balls on the ball-grid-array ("BGA"), the chip and carrier have a tendency to bow upward in the middle, which generates a tensile load on the balls at the center of the array between the carrier and the board or card. This can lead to premature failure of the BGA.

There have been many attempts to mitigate these problems, including stiffeners with a desirable CTE and layers of compliant material within a multi-layer organic printed circuit board or card. Stiffeners are expensive, however, and compliant layers within a board introduce stress concentrations where plated through holes pass through them became of the shear deformation. Thus, the need for reliable and inexpensive ways to accommodate for differential thermal expansion between chips and circuitized organic substrate such as chip carriers and printed circuit boards remains.

SUMMARY

An IC according to an embodiment is described. The IC chip is a flip-chip assembly type having a plurality of solder bumps for making electrical connections to the chip carrier. The IC chip is provided with a stress decoupling structure underneath the under-ball-metallurgy pad ("UBM") of the solder bumps. The stress decoupling structure is formed from an elastic polymer layer provided over the active surface of the integrated circuit chip. The elastic polymer layer may be laminated on or spun on the chip surface. A plurality of conductive metal posts are formed in the elastic polymer layer, each of the metal posts extending between one of the contact pads on the active surface of the chip and one of the under-ball-metallurgy pads. A solder bump is provided on each of the under-ball-metallurgy pads which are used to provide electrical interconnection to a chip carrier when the chip is assembled into a flip-chip type semiconductor package assembly.

According to another embodiment, a semiconductor package incorporating the above-described IC chip having a stress decoupling structure is also described. Such semiconductor package may optionally incorporate an underfill material underneath the chip encapsulating the solder bump connections to further enhance the stress decoupling function of the stress decoupling structure of the IC chip.

The IC chips and the semiconductor package incorporating such IC chips described herein accommodate the differential expansion between the chip and the organic dielectric carriers, boards or other substrates to which the chips are attached. Such accommodation is enabled through a stress decoupling structure provided on the chip underneath the solder bumps and improves the reliability life (i.e. the fatigue life) of the solder bump connections associated with the metal fatigue of the solder bump connections formed by the solder bumps in a semiconductor package assembly.

DETAILED DESCRIPTION

Figure 1:
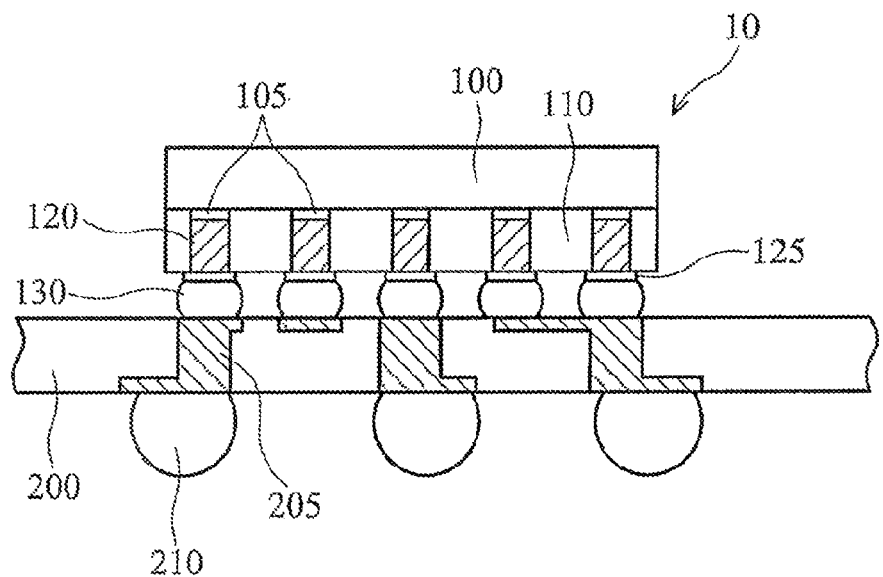
FIG. 1 is a schematic cross-sectional view of an electronic package according to an embodiment of this invention.

FIG. 1 illustrates a semiconductor package 10 according to an embodiment of this invention. In this electronic package, an integrated circuit chip 100 is connected to a circuitized chip carrier 200 by flip-chip solder bumps 130. The solder bumps 130 form electrical connection between the chip 100 and the circuit elements 205 on the circuitized chip carrier 200.

In the integrated circuit chip 100, to improve the reliability of the solder bumps 130, specifically the fatigue life of the solder bumps 130 in an semiconductor package 10, a stress decoupling layer 110 is provided on the active surface 102 of the integrated circuit chip 100. Within the stress decoupling layer 110 are a plurality of conductive metal posts 120 providing electrical connection between contact pads 105 on the active surface 102 of the integrated circuit chip and the under-ball-metallurgy ("UBM") pads 125. The UBM pads 125 are provided on the surface of the stress decoupling layer 110 and the solder bumps 130 are formed on the UBM pads 125.

The stress decoupling layer 110 is a layer of photo-sensitive elastic polymer contained therein an array of conductive metal posts 120. The stress decoupling layer 110 will be interchangeably referred to herein as a layer of photo-sensitive elastic polymer. The stress decoupling layer and the conductive metal posts 120 may be fabricated using the following processes. A layer of photo-sensitive elastic polymer 110 is applied to the active surface 102 side of the chip 100. Although this exemplary process will be described referring to a singular chip 100, it is readily understood by one of ordinary skill in the art that generally, this process would be performed on a plurality of chips in a wafer form. Some commonly used photo-sensitive elastic polymers are made by Hitachi chemicals, Tokyo Ohka Kogyo, Co., Ltd., or Clariant. The photo-sensitive elastic polymer 110 maybe laminated on to or spun on the chip 100. If the elastic polymer is laminated on, a photo-sensitive adhesive is first applied to the active surface side of the chip 100 and then the elastic polymer in a dry-film format is laminated on to the chip 100. Preferably, the photo-sensitive adhesive would be made of the same or compatible polymer material as the photo-sensitive elastic polymer 110 because the via pattern for the conductive metal posts has to be exposed developed in the elastic polymer layer 110 and the photo-sensitive adhesive. The photolithographic process of exposing and developing the via pattern in the elastic polymer layer 110 and the adhesive layer will be more controllable and uniform if the tow polymer materials are the same or compatible.

The diameter of the vias developed in the elastic polymer layer 110 is preferably the same size as the diameter of the passivation opening of the contact pads on the active surface 102 of the chip 100. Next, a layer of Cu metal is deposited on to the bottom and the side walls of the via openings in the elastic polymer layer 110 by chemical plating. A photoresist dry-film is laminated on top of the elastic polymer layer 110 and then developed to expose the via openings in the elastic polymer layer 110. Some commonly used photoresist dry-film material are made by Hitachi chemicals, Tokyo Ohka Kogyo, Co., Ltd., or Clariant. The via openings are then filled with Cu metal by electro-plating process. The photoresist dry-film is chemically stripped. Next, UBM pads 125 (generally having Ti—Cu—Ni metallurgy) are sputtered on to the exposed Cu-filled vias, the metal posts 120. The solder bumps 130 are then sputtered on to the UBM pads.

The elastic polymer layer 110 is about 100 μm thick, thus, resulting in 100 μm tall conductive metal posts 120. The elastic polymer layer and the metal posts in combination form a stress decoupling structure for the semiconductor package 10. For a given diameter of metal posts and the pitch between the metal posts, the height of the metal posts should be sufficiently high to provide the stress decoupling effect necessary to improve the fatigue life of the solder joints formed by the solder bumps 130 in an electronic packaging assembly. The stress being decoupled by the structure is the stress caused by the mismatch of coefficient of thermal expansion between the Silicon based integrated circuit chip 100 and the circuitized chip carrier 200 and, thus, the taller the Cu metal posts, the better the reliability of the solder joint would be. According to the current integrated circuit pad design rules being used for flip-chip applications, the solder bump pitch (i.e. the center-to-center distance of the solder bumps 130) could be from 200 to 100 μm and the diameter of the solder bumps can be in the range of 100 to 50 μm. Thus, the metal posts 120 can have center-to-center pitch of from 200 to 100 μm and diameter between 100 to 50 μm. These dimensions results in the spacing between the metal posts in the range of 100 to 50 μm. The aspect ratio of the metal posts' height/diameter can be from about 1.0 to 0.3. In one preferred embodiment, the spacing and the diameter of the metal posts are the same or similar size.

Figure 2:
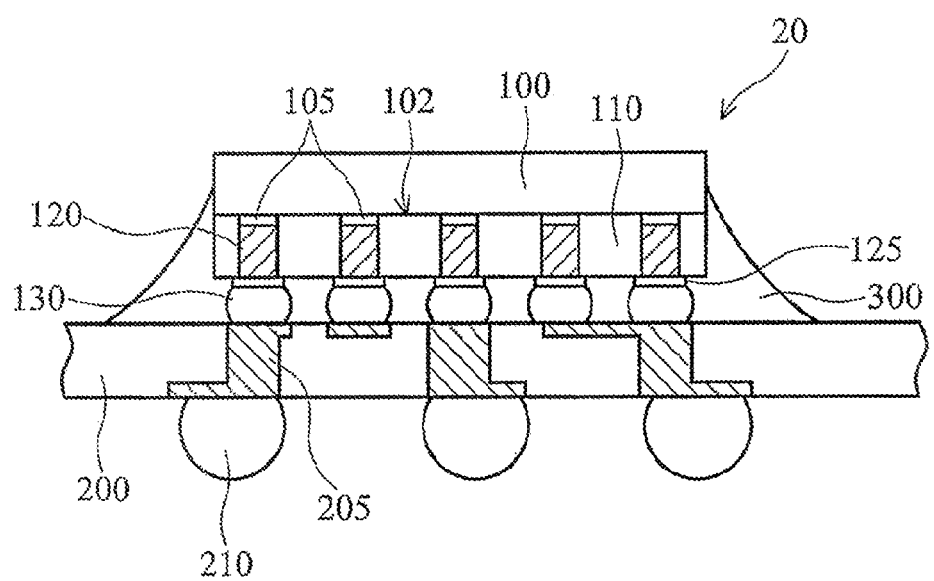
FIG. 2 is a schematic cross-sectional view of an electronic package according to another embodiment of this invention.

During the assembly process of the semiconductor package 10, the integrated circuit chip 100 is flipped on to the chip carrier 200 in the orientation shown and the whole package 10 is then heated to reflow the solder bumps 130 completing the connections between the chip 100 and the chip carrier 200. The circuit elements 205 to a set of second level packaging (the first level being the connection between the chip and the carrier formed by the solder bumps 130) connection structures. The circuit elements 205 generally represent the various conductive metallization structures within the chip carrier 200 and can be vias or lines. The second level packaging connection structures can be any one of known structures such as pins, solder contacts, etc. In FIGS. 1 and 2, for example, a plurality of solder ball contacts 210, also referred to as a Ball Grid Array or BGA, are illustrated on the bottom of the hip carrier 200. The BGAs 210 provide electrical connection to the next level packaging hardware such as printed circuit board, card, etc.

FIG. 2 illustrates a semiconductor package 20 according to another embodiment, incorporating the use of underfill material. The semiconductor package 20 is essentially the same as the package 10 of FIG. 1, except that package 20 has an underfill 300 surrounding the solder bump connections 130 between the chip 100 and chip carrier 200. The underfill 300, which may be any of a number of commercially available materials designed for this purposes, is normally dispensed in a liquid form around the periphery of the chip after the chip has been attached to the substrate. The underfill material gets drawn into the space between the integrated circuit chip 100 and the circuitized chip carrier 200 by capillary action. The underfill material fills the space between the chip and the substrate immersing the solder bump connections 130. The underfill material is then cured into solid form. The underfill may also be applied to the chip or the carrier and cured simultaneously with the solder bump reflowing step. In this embodiment, the solidified underfill layer and the stress decoupling structure formed by the elastic polymer layer 110 and the metal posts 120 share the strain generated by the differences in expansion and contraction of the chip 100 and the chip carrier 200. This synergistic effect will further reduce the strain imposed on the solder bump connections 130.

As those skilled in the art will appreciate from the foregoing description, this invention provides an effective, practical and cost effective method for reducing the strain imposed on the flip-chip attachment solder bump connections caused by the mismatch in the CTE of the IC chip and the organic dielectric carrier substrates. Those skilled in the art will also appreciate that many modifications may be made to the materials, structures and methods disclosed above within the scope of this invention, which is defined by the following claims.

What is claimed is:

1. An integrated circuit chip having an active surface and a plurality of contact pads on the active surface, the chip comprising:
   an elastic polymer layer provided over the active surface of the integrated circuit chip;
   a plurality of under-ball-metallurgy pads provided on the elastic polymer layer;
   a plurality of conductive metal posts provided in the elastic polymer layer, each of the metal posts extending between one of the contact pads on the active surface of the chip and one of the under-ball-metallurgy pads, wherein the plurality of conductive metal posts are arranged in an array in which the conductive metal posts have center-to-center pitch of 200 to 100 μm and post diameter of 100 to 50 μm; and
   a solder bump provided on each of the under-ball-metallurgy pads, wherein the solder bumps are used to provide electrical interconnection to a chip carrier when the chip is assembled into an electronic package assembly.

2. An integrated circuit chip of claim 1, wherein the elastic polymer layer is a photoresist.

3. An integrated circuit chip of claim 1, wherein the conductive metal posts have a height of from about 30 to 100 μm and have aspect ratio of height to diameter between about 1 to 3/10.

4. A semiconductor package comprising:
   an integrated circuit chip having an active surface and a plurality of contact pads on the active surface, the integrated circuit chip comprising:
      an elastic polymer layer provided over the active surface of the integrated circuit chip;
      a plurality of under-ball-metallurgy pads provided on the elastic polymer layer; and
      a plurality of conductive metal posts provided in the elastic polymer layer, each of the metal posts extending between one of the contact pads on the active surface of the chip and one of the under-ball-metallurgy pads, wherein the plurality of conductive metal posts are arranged in an array in which the conductive metal posts have center-to-center pitch of 200 to 100 μm and post diameter of 100 to 50 μm;
   a circuitized chip carrier; and
   solder connections between the elastic polymer layer and the circuitized chip carrier forming electrical connections between the integrated circuit chip and the circuitized chip carrier.

5. The semiconductor package of claim 4, wherein the elastic polymer layer is a photoresist.

6. The semiconductor package of claim 4, wherein the conductive metal posts have a height of from about 30 to 100 μm and have aspect ratio of height to diameter between about 1 to 3/10.

7. The semiconductor package of claim 4, further comprising an underfill material encapsulating the solder connections and filling the space between the elastic polymer layer of the integrated circuit chip and the circuitized chip carrier.

8. An integrated circuit chip having an active surface and a plurality of contact pads on the active surface, the chip comprising:
   an elastic polymer layer provided over the active surface of the integrated circuit chip;
   a plurality of under-ball-metallurgy pads provided on the elastic polymer layer;
   a plurality of conductive metal posts provided in the elastic polymer layer, each of the metal posts extending between one of the contact pads on the active surface of the chip and one of the under-ball-metallurgy pads, wherein the conductive metal posts have a height of from about 30 to 100 μm and have aspect ratio of height to diameter between about 1 to 3/10; and
   a solder bump provided on each of the under-ball-metallurgy pads, wherein the solder bumps are used to provide electrical interconnection to a chip carrier when the chip is assembled into an electronic package assembly.

9. An integrated circuit chip of claim 8, wherein the elastic polymer layer is a photoresist.

10. An integrated circuit chip of claim 8, wherein the plurality of conductive metal posts are arranged in an array in which the conductive metal posts have center-to-center pitch of 200 to 100 μm and post diameter of 100 to 50 μm.

* * * * *

UNITED STATES PATENT AND TRADEMARK OFFICE
CERTIFICATE OF CORRECTION

PATENT NO. : 7,573,138 B2  Page 1 of 1
APPLICATION NO. : 11/565375
DATED : August 11, 2009
INVENTOR(S) : Chien-Hsiun Lee and Mirng-Ji Lii It is certified that error appears in the above-identified patent and that said Letters Patent is hereby corrected as shown below:

Column 1, line 22, after "However," delete "three area" and insert -- there are --.

Column 1, lines 32-33, after "CTE," delete "circuited" and insert -- circuitized --.

Column 1, line 42, after "electronic" delete "comments" and insert -- components --.

Signed and Sealed this

Thirtieth Day of March, 2010

David J. Kappos
*Director of the United States Patent and Trademark Office*